United States Patent [19]

Murphy

[11] 3,899,719

[45] Aug. 12, 1975

[54] INTEGRATED CIRCUIT PANEL AND DUAL IN-LINE PACKAGE FOR USE THEREWITH

[75] Inventor: James V. Murphy, Warwick, R.I.

[73] Assignee: Electronic Molding Corporation, Woonsocket, R.I.

[22] Filed: Aug. 30, 1973

[21] Appl. No.: 393,214

[52] U.S. Cl. ........ 317/101 CC; 339/17 CF; 339/153

[51] Int. Cl. .......... H05k 1/04

[58] Field of Search .......... 317/101 CC; 339/17 CF, 339/153 R, 154 R; 29/630 G; 174/DIG. 3

[56] References Cited

UNITED STATES PATENTS

| | | | |
|---|---|---|---|
| 2,902,629 | 9/1959 | Little et al. | 317/101 CC |
| 3,239,720 | 3/1966 | Rayburn | 317/101 CC |
| 3,275,895 | 9/1966 | Flaherty | 317/101 CC |
| 3,325,766 | 6/1967 | Kolb et al. | 317/101 CC |
| 3,341,806 | 9/1967 | Joachim | 317/101 CC |
| 3,545,080 | 12/1970 | Evans | 339/17 CF |
| 3,701,076 | 10/1972 | Irish | 317/101 CC |

FOREIGN PATENTS OR APPLICATIONS

| | | | |
|---|---|---|---|
| 1,140,825 | 1/1969 | United Kingdom | 317/101 CC |
| 1,268,384 | 6/1961 | France | 317/101 CC |

*Primary Examiner*—David Smith, Jr.
*Attorney, Agent, or Firm*—Salter & Michaelson

[57] ABSTRACT

A dual in-line package and terminal for use therewith is provided for mounting on a panel board that has a plurality of female terminals secured in a predetermined pattern therein, the vertical dimension of the body portion of the dual in-line package being greater than the horizontal dimension thereof, wherein the package as mounted on the panel is contained in a limited area and provides for mounting of additional packages on said panel substantially in excess of the number of packages mounted on conventional panel boards known heretofore.

6 Claims, 18 Drawing Figures

INTEGRATED CIRCUIT PANEL AND DUAL IN-LINE PACKAGE FOR USE THEREWITH

BACKGROUND OF THE INVENTION

The present invention relates to a dual in-line integrated circuit package for use with an integrated circuit panel that has a plurality of female terminals mounted in a predetermined patten therein.

Dual in-line integrated circuit packages have been commonly used in computer circuitry and the like and are normally mounted on an integrated circuit panel in which a plurality of female terminals are secured. The conventional integrated circuit package known heretofore included a body portion having a plurality of miniaturized circuit chips of predetermined design embedded therein, the circuits of each chip being electrically interconnected to leads or contacts that depended from the body portion of the package. Conventionally, the lateral dimension of the body portion of the package was greater than the vertical dimension thereof, where the opposed leads of the package were laterally spaced apart a predetermined distance. The panels in which the female terminals were located were normally arranged in a predetermined pattern to accommodate the spacing of the leads as fixed in the packages. Although the integrated circuit package as utilized heretofore accomplished the purpose intended, the physical arrangement thereof with respect to the spacing of the leads materially limited the number of packages that could be mounted on a panel and, as a result, limited the number of circuits that could be carried by the panel and included in a complete assembly. Usually the panel board offered various groups of numerical positions for the packages so as to provide for a maximum grouping of packages depending upon the requirements for a particular circuit. However, if circuit requirements necessitated more groups than could be accommodated by the panel, either the panel had to be enlarged or the electrical circuit had to be redesigned.

The female terminals mounted on the prior known integrated circuit panels also included some form of a spring contact therein, so that when the lead of the integrated circuit package was inserted into the socket of the female terminal, positive electrical communication was established. Use of the spring contact in the female terminal required a special form of terminal for the panel and necessarily increased the overall cost thereof.

SUMMARY OF THE INVENTION

The dual in-line integrated circuit package embodied in the present invention has particular application with an integrated circuit panel having a plurality of female terminals mounted in a predetermined pattern therein. The package as embodied in the subject invention comprises a body portion, the vertical dimension of which is greater than the horizontal dimension thereof. A first set of leads that are fixed in the body portion and that are electrically interconnected to circuit chips embedded therein project from the bottommost end of the body portion, while a second set of the leads project from the top of the body portion and are bent into parallel relation with respect to the leads of the first set. The spacing of the parallel sets of leads are such that the package is received in an especially designed panel that accommodates a plurality of the packages thereon; and in comparison to standard integrated circuit panels, the spacing of the leads also provides for the mounting of a substantially greater number of the packages on the panel.

The present invention further incorporates a variation in the end portion of the leads that project outwardly of the packages; and in several forms of the invention, such leads include spring portions that are received in the female terminals of the panel board; and in this form of the invention, the conventional spring contact normally located in the terminal is eliminated therefrom. The present invention also contemplates modifying the conventional package by bending the contacts thereof and incorporating an adapter for use therewith, wherein the prior known package may be used in the panel board of the subject invention.

Accordingly, it is an object of the present invention to provide a dual in-line integrated circuit package for use with an integrated circuit panel, wherein a greater number of the packages may be mounted on the panel then in the prior known conventional panel arrangements.

Another object of the invention is to provide an integrated circuit package in which the leads thereof are provided with spring portions that avoid the use of spring contacts in the female terminals in which the leads are received, thereby providing for improved electrical communication therebetween.

Still another object of the invention is to provide an adapter assembly for use with an integrated circuit package of conventional construction that enables the package to be incorporated in the integrated circuit panel of the present invention.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE EMBODIMENTS OF THE INVENTION

Figures 1, 2, 3, 4:
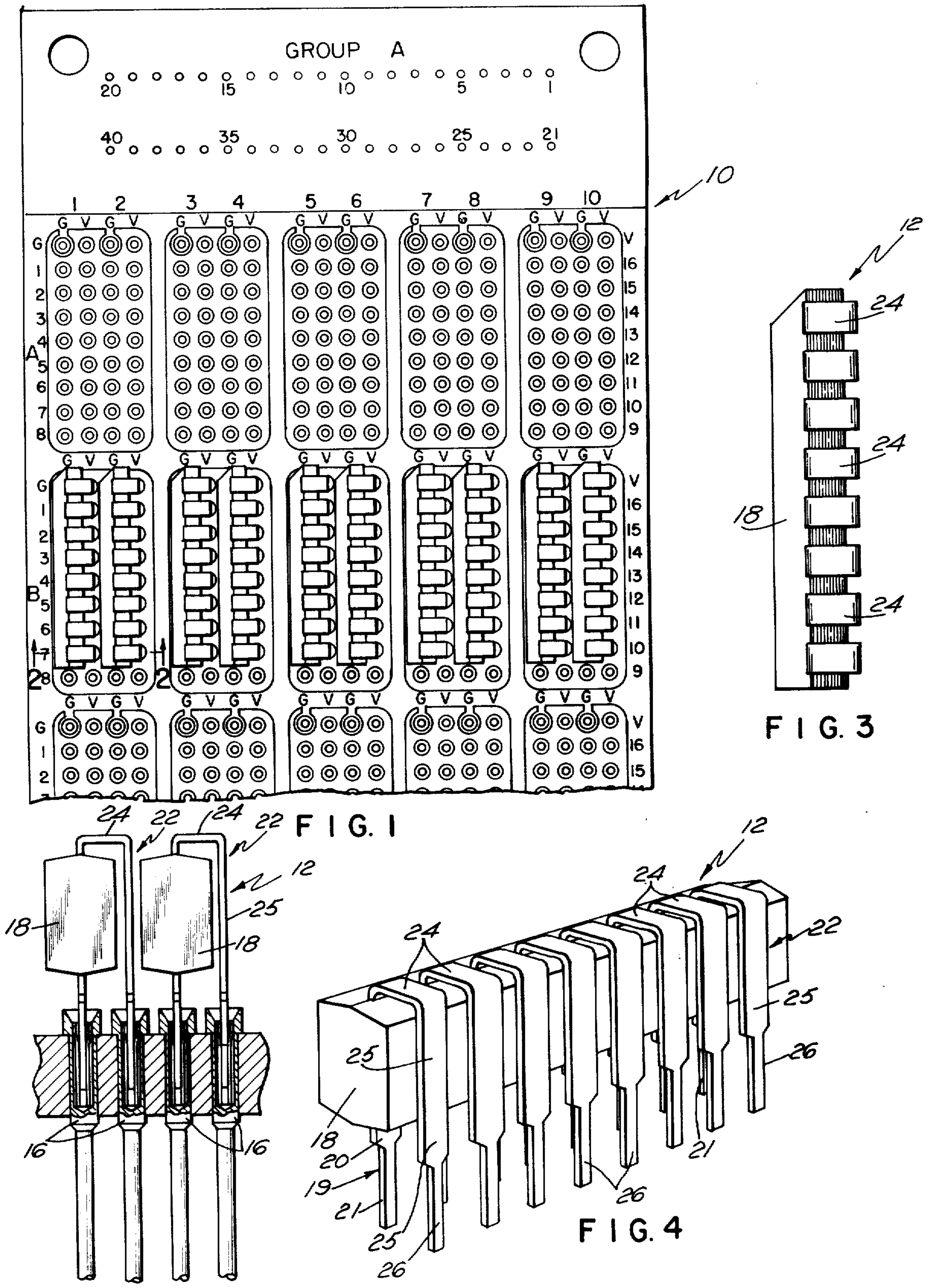
FIG. 1 is a top plan view of an integrated circuit panel board embodied in the present invention illustrating the location of a plurality of dual in-line packages of the subject invention as mounted thereon.
FIG. 2 is a sectional view taken along line 2—2 in FIG. 1.
FIG. 3 is a top plan view of the dual in-line package illustrated in FIG. 2.
FIG. 4 is a perspective view of the dual in-line package illustrated in FIGS. 2 and 3.

Referring now to the drawings and particularly to FIG. 1, a panel board generally indicated at 10 is illustrated and is representative of the type of panel board that is especially constructed and arranged for use with a dual in-line package of the subject invention, one form of which is generally indicated at 12 and is illustrated in FIGS. 2, 3 and 4. The panel 10 is adapted for use in a variety of electrical circuits, such as in computer circuitry and the like; and formed in the panel 10 are a plurality of openings in which female electrical terminals 16, shown in FIG. 2, are mounted. The location of the openings in the panel 10 and the female terminals 16 as fixed in the openings are especially designed for use with the dual in-line integrated circuit package 12; and with reference to FIGS. 1 and 5, these openings are shown located in groups and identified under the numerical headings "1 . . . 10", each heading having a subheading G and V thereunder. Each pair of openings under the subheading G and V receive spaced leads of a package 12, the package having eight pairs of spaced leads fixed thereto as is conventional in integrated circuit packages.

In the practical application of the packages 12, the spacing of the opposed leads and the lateral spacing between the openings in the panel board 10 in the various groupings is approximately 0.100 inches. This compares to spacing between the leads and openings of conventional packages and panels known heretofore, wherein the spacing was approximately 0.200 inches; and as a result, only a limited number of packages of conventional design could be mounted on the prior known panel board.

In order to accomplish the purpose of mounting an increased number of integrated circuit packages on the panel board 10, the package 12 is provided and, as illustrated in FIG. 4, is arranged and constructed such that the leads thereof are receivable in pairs of openings as formed in the panel board 10 and located under the headings identified as 1, 2, 3...10. Referring again to FIG. 4, the integrated circuit dual in-line package 12 includes a body portion 18 in which conventional circuit chips are embedded, the material from which the body portion 18 is formed being conventional in composition and forming no part of the present invention.

Electrically interconnected to the chips as embedded in the body portion 18 of the package 12 are a plurality of leads generally indicated at 19 that depend from the bottommost end of the body portion and centrally thereof. Each of the leads 19 includes an upper portion 20 that extends into the body portion 18 and a lower reduced portion 21 that projects into a terminal 16 in the panel board. Extending outwardly from the topmost end of the body portion 18 are a plurality of leads generally indicated at 22, each of which is bent at right angles to define a top portion 24 and then bend again at right angles relative to the top portion 24 to form an elongated portion 25 that extends downwardly adjacent to the side of the body portion 18 and in parallel relation to the opposite lead 19. The lowermost end of each lead 22 is reduced as indicated at 26, the reduced ends 21 and 26 of the leads 19 and 22, respectively, being receivable in electrical engagement with spring contacts located within the terminals 16 mounted in the panel 10.

Figures 5, 5A, 5B, 6, 6A, 7, 8, 9, 10, 11:
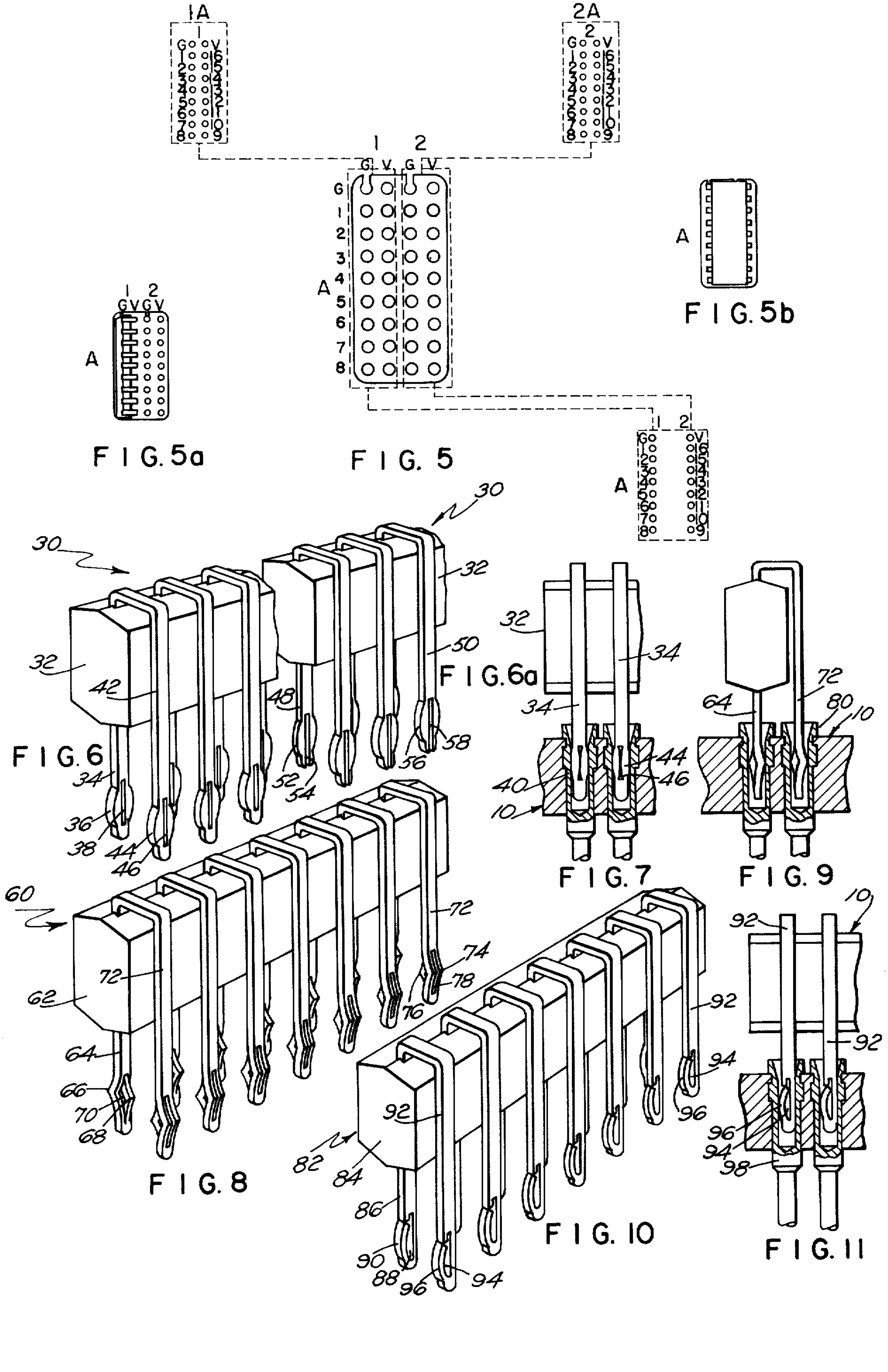
FIG. 5 is a schematic illustration of a portion of the panel board shown in FIG. 1 and illustrating various locations for mounting of dual in-line packages thereon.
FIG. 5*a* is a top plan view of a portion of the panel as shown in FIG. 5 on which a dual in-line package of the subject invention is mounted.
FIG. 5*b* is a top plan view similar to FIG. 5*a* showing a conventional dual in-line package mounted on a portion of the panel of the subject invention.
FIG. 6 is a perspective view of the dual in-line package embodied herein having a modified form of lead joined thereto.
FIG. 6*a* is a view similar to FIG. 6 showing a variation of the lead illustrated in FIG. 6.
FIG. 7 is a sectional view of a portion of a panel board illustrating the mounting of the leads shown in FIG. 6 in terminals secured in the panel board.
FIG. 8 is a perspective view of the dual in-line package embodied herein showing a further modified form of lead.
FIG. 9 is a sectional view of a portion of a panel board illustrating the mounting of the leads shown in FIG. 8 in terminals of the panel board.
FIG. 10 is a perspective view of a dual in-line package showing a further modified lead.
FIG. 11 is a sectional view similar to FIG. 8 showing the terminal illustrated in FIG. 10 as mounted in terminals on the panel board.

Since the vertical dimension of the body portion 18 of the package 12 is greater than the lateral dimension thereof, the spacing between the leads 19 and 22 is relatively reduced, and the reduced ends 21 and 26 of the leads 19 and 22 are accommodated in a pair of the terminals 16 as mounted in the openings located in the panel board 10. With rèference to FIG. 5, a portion of the panel board 10 is illustrated and shows the location of the openings under the headings 1 and 2. The headings indicated as 1A and 2A indicate the groups of openings for receiving the packages 12 and illustrates that a single package 12 can be accommodated in the openings under each heading. Since both locations 1A and 2A, as shown, can receive the packages 12 in the openings therein, it is seen that the packages 12 may be located in side-by-side relation on the panel board under the headings 1 and 2. In FIG. 5*a*, a single package is shown mounted in position in location A, the openings under heading 2 being exposed. This also illustrates the relatively narrow configuration of the package 12. In FIG. 5*b* a conventional integrated circuit package is shown occupying the space normally utilized thereby; and as represented by the isolated location in FIG. 5 that is removed from the bottom of location A, the end openings as shown accommodate the wider spacing of the leads of the prior known package. It is seen that openings as located in the prior known panel decrease by one-half the number of packages that can be accommodated by panel 10 as described herein. It is further seen that by rotating the package 12 90° with respect to position of use of the conventional package, the leads 19 and 22 can be spaced relatively close together; and twice the number of the packages 12 can be accommodated in the terminals as located in the openings formed in the panel 10 than as previously used in the prior known panel.

Referring now to FIGS. 6, 6*a* and 7, a modified form of lead for use with the integrated circuit package of the subject invention is illustrated. The integrated circuit package as shown in FIGS. 6 and 6*a* is generally indicated at 30 and includes a body portion 32 in which circuit chips are embedded. Depending from the bottommost end of the body portion 32 and intermediate the sides thereof are a plurality of leads 34. Formed on each of the leads 34 adjacent to the lowermost end thereof are opposed projections or bulbous portions 36 between which an elongated slot 38 is formed. The elongated slot 38 provides for flexibility of the projections 36 when the lead is inserted into a terminal 16 located in the panel board 10. As shown in FIG. 7, a terminal 40 is fixed in an opening in the panel board 10, except that in terminal 40 the internal spring normally utilized for receiving a lead in engagement therewith is eliminated. Removal of the spring from the terminal 40 is accomplished because of the shape and construction of the projections 36 as formed on the lowermost end of the leads 34. It is seen that when the lead 34 is inserted into a terminal 40 as located in the panel board 10, the projections 36 engage the internal walls of the terminal 40 and are squeezed together as permitted by the elongated slot 38. The conformation of the projections 36 and the slot 38 insure proper electrical communication between the lead 34 and the terminal 40.

As further illustrated in FIG. 6, additional leads 42 project outwardly of the body 32 of the package 30 at the uppermost end thereof and are bend at right angles to project downwardly of the body portion 32 in parallel relation with respect to the leads 34. The lowermost ends of the leads 42 are formed similarly to that for the leads 34 and include opposed projections 44 between which a slot 46 is formed. The function and purpose of the projections 44 are the same as that discussed hereinabove with respect to projections 36, the projections 44 also being received in a terminal 40 for establishing electrical communication between the terminal 40 and the leads 42.

Referring now to FIG. 6*a*, a modified form of the lead shown in FIG. 6 is illustrated for use with the package 32 and includes leads 48 and 50 that project from the bottommost and topmost ends of the body portion 32. Formed on the lead 48 adjacent to the bottommost end thereof are projections 52 between which a slot 54 extends, the slot 54 projecting through the lowermost ends of the lead 48 to separate the lead into the opposed projections 52. The leads 50 are similarly formed and include projections 56 formed on the lowermost ends thereof that are separated by a longitudinally extending slot 58. It is understood that when the projections 52 and 56 are inserted into terminals in the panel board 10, the spacing of the projections as formed on the lowermost ends thereof provides for biased movement of the projections to insure proper electrical communication between the leads and the terminals in which they are inserted.

Referring now to FIGS. 8 and 9, a still further modified form of the lead for the integrated circuit package as embodied in the subject invention is illustrated; and as shown in FIGS. 8 and 9, an integrated circuit package is generally indicated at 60 and includes a body portion 62, the vertical dimension of which is greater than the lateral dimension thereof. Depending from the bottom of the body portion 62 of the package 60 are a plurality of leads 64. Formed on the lower end of each of the leads 64 are opposed projections 66 and 68, the projection 68 being cut out to define a longitudinally extending slot 70 between the projections. The projection 66 is formed by upsetting or deforming the lower end of the lead 64, the projection 68 also being bent to form an angle as cut out from the slot 70. The projections 66 and 68 as formed are located on the opposed faces of the leads 64 as opposed to the formation of the projections 36 and 52 on the side edges of the leads. As further shown in FIG. 8, leads 72 project from the topmost end of the body portion 62 of the package 60 and terminate at their lowermost ends thereof in opposed projections 74 and 76, the projections 76 being struck out from the portion of the contact 72 adjacent to the projection 74 to define the slot 78. The projections 74 and 76 are formed similar to the projections 66 and 68 and are located on the wide portions or faces of the lead 72 as opposed to the side edges thereof. As illustrated in FIG. 9, a plurality of female terminals 80 are mounted in the panel board 10 and are shaped and constructed for directly receiving therein the lowermost ends of the leads 64 and 72, which include the projections 66, 68 and 74, 76, respectively. Since the leads 64 and 72 have the spring biased projections 66, 68 and 74, 46 formed thereon, the spring contact that would normally be located in terminal 80 is removed therefrom.

Referring now to FIGS. 10 and 11, a still further modified form of lead for use with a package is illustrated; and as shown, an integrated circuit package generally indicated at 82 is provided that is formed with a body portion 84. Depending from the lower end of the body portion 84 are leads 86, the lowermost ends of which are slotted at 88 and struck out to define a curved spring finger 90. Leads 92 project from the uppermost end of the body portion 84 and are bent into parallel relation with respect to the lead 86, the lowermost ends of the leads 92 having a slot 94 formed therein from which the spring fingers 96 are struck. The spring fingers 90 and 96 define spring contacts which, as illustrated in FIG. 11, engage the interior walls of terminals 98 mounted in the panel 10 for establishing electrical communication therebetween and the leads 86 and 92, respectively.

Figures 12, 13, 14, 15:
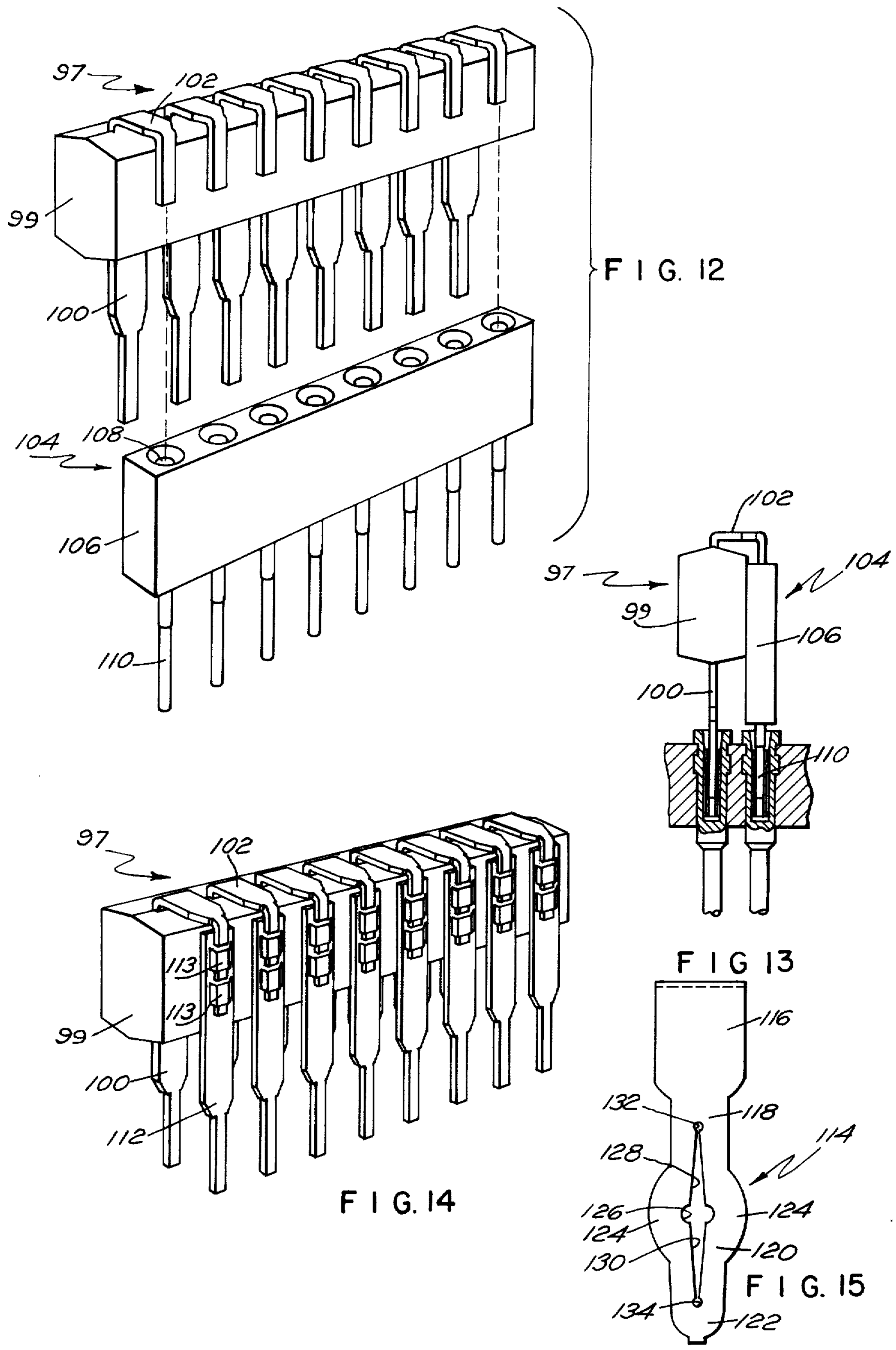
FIG. 12 is an exploded perspective view of a conventional dual in-line package as used with an adapter for mounting on the panel board of the subject invention.
FIG. 13 is a sectional view of the dual in-line package and adapter illustrated in FIG. 12 as mounted on a panel board.
FIG. 14 is a perspective view of a modified form of adapter for use with the conventional dual in-line package illustrated in FIG. 12.
FIG. 15 is a front elevational view of a still further modified form of lead as used with the terminals illustrated in FIGS. 7, 9 and 11.

As referred to hereinabove, the prior known integrated circuit package is constructed such that the lateral dimension thereof is somewhat greater than the vertical dimension. The leads for the prior known package project outwardly of the sides of the body of the integrated circuit package and depend therebelow in parallel relation for mounting in terminals of a circuit board panel. The present invention contemplates utilizing the prior known integrated circuit package and modifying it for use with the panel board 10 of the subject invention. In order to accomplish this purpose, the leads of the prior known integrated circuit package must be bent in a manner such that the body portion thereof is rotated 90° with respect to the normal position of use. In order to illustrate the use of the prior known integrated circuit package with panel 10, reference is made to FIG. 12, wherein an integrated circuit package is generally indicated at 96 and includes a body portion 99 of conventional construction. Leads 100 which normally extend from the sides of the piror known package and are bent at right angles thereto depend directly from the bottom of the body portion 99 in the position of intended use of the package 97; and instead of being bent, the leads 100 which are formed with reduced ends are directed straight and downwardly as illustrated. Leads 102 which are also formed with reduced ends project outwardly from the top of the body 99 of the package 97 and are bent in the manner as illustrated; but since these leads as normally constructed are not designed for use in the panel board 10, the length thereof is foreshortened with respect to the leads 100. In order to adapt the leads 102 for use with the panel board 10, an adapter assembly generally indicated at 104 is provided and is formed with a body portion 106 in which a plurality of vertically extending openings 108 are formed. The openings 108 have terminals inserted therein, each of which includes a contact leg 110 that projects below the body portion 106 of the adapter assembly 104. The openings 108 in the adapter assembly are spaced apart and are disposed in alignment with the reduced ends of the leads 102; and in use, as shown in FIG. 13, the reduced ends of the leads 102 are received within the openings 108 and in engagement with the terminals secured therein. The reduced ends of the leads 100 and the downwardly projecting contact legs 100 are received in appropriate terminals as mounted in the panel 10.

In order to avoid the use of the adapter assembly 104, individual adapters indicated at 112 in FIG. 14 may be employed. As illustrated in FIG. 14, the package 97 is formed in the manner as illustrated in FIG. 12 and includes a body portion 99 from which a plurality of leads 100 depend from the lowermost end thereof and from which a plurality of leads 102 project from the uppermost end, the leads 102 being bent so as to include a portion that is disposed in parallel relation with respect to the leads 100. The individual adapters 112 include spaced clips 113 that receive the reduced end of the lead 102 therein. The length of the adapters 112 are such that the lowermost ends thereof which are reduced are located substantially equal and opposite to the lowermost reduced ends of the leads 100. With adapters 112 secured to the leads 102 in the manner as illustrated, the package 97 is mountable on the panel board 10 with the leads 100 and adapters 112 being received in the appropriately located terminals therein.

Referring now to FIG. 15, a still further modified form of lead is illustrated and is generally indicated at 114. The lead 114 is intended for use with a dual in-line package such as illustrated in FIGS. 2, 6, 8 and 10 and is electrically interconnected to a circuit embedded in the body of the package. It is also understood that a plurality of the leads 114 will be secured to the package in the manner illustrated and described above in connection with the aforesaid described leads. The lead 114 includes an upper portion 116 to which a reduced section 118 is joined. A central section 120 is joined to the reduced section 118 and a lower section 122 projects downwardly from the central section 120. Formed on the central section 120 are rounded enlargements or projections 124 that define contact portions when the lead is inserted into a socket of a female terminal of the type illustrated in FIGS. 7, 9 or 11. In order to provide for a spring action of the lead 114, when it is inserted into the terminal, a slot is formed in the lead. The slot is defined by a central opening 126 located in the central section 120 and tapered slots 128 and 130 that extend outwardly from the opening 126, the slots 128, 130 terminating in smaller openings 132 and 134 formed in the reduced section 118 and lower section 122, respectively. It is seen that when the lead 114 is inserted into a socket of a terminal located in a panel board, the projections 124 will engage the walls of the socket in electrical communication, the slot as formed in the lead providing for limited inward movement of the projections as the lead is forced inwardly into the terminal socket. Positive electrical contact is thereby established between the lead and the terminal in which the lead is received.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. An integrated circuit panel assembly comprising, a panel board having a plurality of female terminals secured in a predetermined pattern therein, and a plurality of dual in-line integrated circuit packages mounted on said panel board, each of said integrated circuit packages including a body portion, the vertical dimension of which is greater than the horizontal dimension thereof in the normal position of use thereof as mounted on said panel, a plurality of integrated circuits embedded in said body portion, and a plurality of leads electrically interconnected to said embedded integrated circuits and projecting outwardly of said body portion, a first set of said leads being located in the bottom of said body portion and projecting downwardly therefrom in the position of use of said package and extending into corresponding aligned female terminals located in said panel, a second set of said leads being located in opposed relation to said first set at the top of said body portion, the leads of said second set being bent to depend downwardly in parallel and close adjacent relation to said first set in the position of use of said package and electrically communicating with corresponding aligned female terminals located in said integrated circuit panels, the leads of one set being vertically foreshortened, and an adapter being interconnected to each of the foreshortened leads and being receivable in a terminal.

2. An integrated circuit panel assembly as claimed in claim 1, each of the adapters being mounted on an adapter assembly in which a plurality of terminals are located for receiving the foreshortened leads, each adapter being electrically interconnected to a latter named terminal.

3. An integrated circuit panel assembly as claimed in claim 1, said adpter having an elongated body portion on which at least one clip is formed, said clip being secured to a foreshortened lead for interconnecting the lead to said adapter.

4. A dual in-line integrated circuit module for mounting on an integrated circuit panel having a plurality of female terminals secured in a predetermined pattern therein, comprising, a body portion the vertical dimension of which is greater than the horizontal dimension thereof in the normal position of use thereof as mounted on said panel, a plurality of integrated circuits embedded in said body portion, a plurality of leads electrically interconnected to said embedded integrated circuits and projecting outwardly of said body portion, a first set of leads located in the bottom of said body portion and projecting downwardly therefrom in the position of use of the module and extending into corresponding aligned female terminals located in said panel, a second set of said leads located in opposed relation to said first set and projecting from the top of said body portion in the position of use of said module on said panel, the leads of said second set being bent to depend downwardly in parallel relation to said first set, but being foreshortened with respect to the vertical dimension thereof, and an adapter interconnected to each of the foreshortened leads, the adapter having a downwardly extending lead formed thereon that projects into a female terminal in said panel for establishing electrical communication between said module circuits and panel terminals.

5. A dual in-line integrated circuit module as claimed in claim 4, an adapter assembly in which the adapters interconnected to said foreshortened leads are included, said adapter assembly including a body portion in which the adapters are integrally molded, each adapter including a socket fixed in said body for receiving a foreshortened lead therein and a contact leg joined to said female socket and projecting below said body portion and being received in a female terminal in said panel.

6. An adapter assembly for use with an integrated circuit module having a first set of leads projecting from a lower portion thereof and a second set of leads projecting from an upper portion thereof and bent to project downwardly in parallel relation to said first set, but foreshortened with respect to the vertical dimension thereof, comprising an elongated body portion molded of a insulating plastic material, a plurality of vertically extending openings formed in said body portion in horizontal spaced relation, and an adapter element fixed in each of said openings, each adapter element including a socket portion that is located in an opening and that receives a foreshortened lead of said second set therein, and a contact leg joined to said socket portion and projecting below said body portion for entry into a female terminal of a panel board on which said module is to be mounted in electrical communication.

* * * * *